(12) United States Patent
Wacquez et al.

(10) Patent No.: US 7,803,668 B2
(45) Date of Patent: Sep. 28, 2010

(54) TRANSISTOR AND FABRICATION PROCESS

(75) Inventors: Romain Wacquez, Grenoble (FR);
Philippe Coronel, Barraux (FR); Jessy Bustos, Le Touvet (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 260 days.

(21) Appl. No.: 11/710,599

(22) Filed: Feb. 23, 2007

(65) Prior Publication Data
US 2007/0278575 A1 Dec. 6, 2007

(30) Foreign Application Priority Data

Feb. 24, 2006 (FR) .................... 06 01662
Feb. 24, 2006 (FR) .................... 06 01663

(51) Int. Cl.
*H01L 21/335* (2006.01)
(52) U.S. Cl. ............... 438/142; 438/128; 257/E29
(58) Field of Classification Search ............... 438/279, 438/197, 665, 666
See application file for complete search history.

(56) References Cited

U.S. PATENT DOCUMENTS

| 5,045,592 | A | 9/1991 | Weiss et al. |
| 5,085,893 | A | 2/1992 | Weiss et al. |
| 5,370,903 | A | 12/1994 | Mine et al. |
| 5,486,564 | A | 1/1996 | Mine et al. |
| 6,306,560 | B1 * | 10/2001 | Wang et al. ............ 430/316 |
| 6,861,751 | B2 | 3/2005 | Tao |
| 2004/0016968 | A1 | 1/2004 | Coronel et al. |
| 2004/0166642 | A1 | 8/2004 | Chen et al. |
| 2004/0209463 | A1 * | 10/2004 | Kim et al. ............ 438/666 |
| 2005/0124120 | A1 | 6/2005 | Du et al. |
| 2005/0189583 | A1 | 9/2005 | Kim et al. |
| 2005/0242395 | A1 | 11/2005 | Chen et al. |
| 2006/0003596 | A1 | 1/2006 | Fucsko et al. |

FOREIGN PATENT DOCUMENTS

| EP | 0 778 612 A2 | 6/1997 |
| FR | 2 838 238 | 10/2003 |
| WO | WO 2007/017613 A1 | 2/2007 |

OTHER PUBLICATIONS

Takashi Nakamura et al., "Oxidative Curing of Hydrogen Silsesquioxane Resin Films by Electron Beam Irradiation without Additional Heatings and Characterization of the Cured Films," Japanese Journal of Applied Physics, Japan Society of Applied Physics, Tokyo, JP, vol. 40, No. 11, Part 1, Nov. 2001, pp. 6187-6191.

(Continued)

*Primary Examiner*—Thanh V Pham
*Assistant Examiner*—Mark A Laurenzi, III

(57) ABSTRACT

Process for fabricating a transistor, in which an electron-sensitive resist layer lying between at least two semiconductor fingers is formed and said resist lying between at least two wires is converted into a dielectric. For example, in one embodiment of the present disclosure an integrated circuit includes a transistor having an insulating substrate including, for example, based on silicon oxide. Transistor also includes a conducting gate region comprising, for example, TiN or polysilicon, formed on a localized zone of the upper surface of the substrate, and an isolating region, comprising, for example, silicon oxide and surrounding the conducting region. The conducting region is also bounded in the direction normal to the plane of the drawing.

17 Claims, 5 Drawing Sheets

OTHER PUBLICATIONS

Chi-Fa Lin et al., "Effects of Methyl Silsesquioxane Electron-Beam Curing on Device Characteristics of Logic and Four-Transistor Static Random-Access Memory," Japanese Journal of Applied Physics, Japan Society of Applied Physics, Tokyo, JP, vol. 38, No. 11, Nov. 1999, pp. 6253-6257.

David M. Fried et al., "A Fin-Type Independent-Double-Gate NFET," 3 pages.

D. P. Mancini et al., "Hydrogen Silsesquioxane for Direct Electron-Beam Patterning of Step and Flash Imprint Lithography Templates," J. Vac. Sci. Technol. B 20(6) Nov./Dec. 2002, 2002 American Vacuum Society, pp. 2896-2901.

Euan J. Boyd et al., "Three Dimensional HSQ Structures Formed Using Multiple Low Energy Electron Beam Lithography," Elsevier Science, pp. 1-5.

S. Harrison et al., "Highly Performant Double Gate MOSFET Realized with SON Process," 2003 IEEE, 4 pages.

S. Harrison et al., "Poly-Gate REplacement Through Contact Hole (PRETCH): A New Method for High-K/Metal Gate and Multi-Oxide Implementation on Chip," 3 pages.

R. Cerutti et al., "New Design Adapted Planar Double Gate Process for Performant Low Standby Power Application," 2 pages.

Fu-Liang Yang et al., "5nm-Gate Nanowire FinFET," 2004 IEEE, 2004 Symposium on VLSI Technology Digest of Technical Papers, pp. 196-197.

"Dow Corning Litigates HSQ Patents," Aug. 2, 2001, http://www.thinfilmmfg.com/subscribers/Subscriber01/HSQ2Aug01.htm.

Hon-Sum Philip Wong et al., "Self-Aligned (Top and Bottom) Double-Gate MOSFET with a 25nm Thick Silicon Channel," 1997 IEEE, pp. 16.6.1-16.6.4.

* cited by examiner

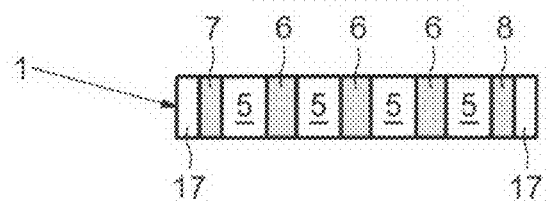
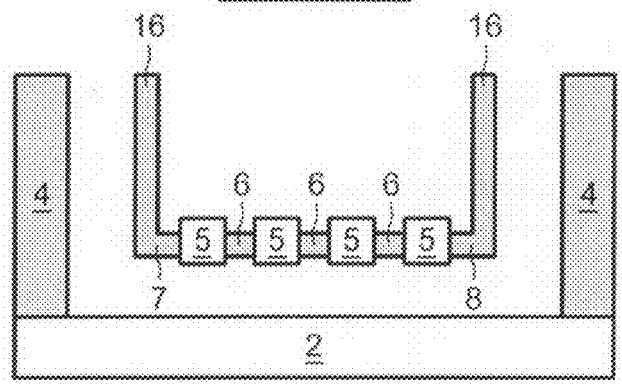
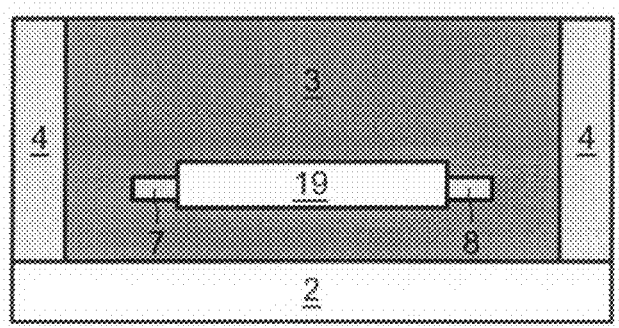

US 7,803,668 B2

TRANSISTOR AND FABRICATION PROCESS

CROSS-REFERENCE TO RELATED APPLICATIONS

The present application is related to French Patent Application No. 06/01663, filed Feb. 24, 2006, entitled "TRANSISTOR FABRICATION PROCESS AND TRANSISTOR" and 06/01662, filed Feb. 24, 2006, entitled "TRANSISTOR FABRICATION PROCESS AND TRANSISTOR". French Patent Application Nos. 06/01663 and 06/01662 are assigned to the assignee of the present application and are hereby incorporated by reference into the present disclosure as if fully set forth herein. The present application hereby claims priority under 35 U.S.C. §119(a) to French Patent Application Nos. 06/01663 and 06/01662.

TECHNICAL FIELD

The present disclosure relates to the field of transistors. In particular, the present disclosure relates to transistors having semiconductor nanofingers and to integrated circuits comprising such transistors. Additionally, the present disclosure also relates to fabrication processes for transistors having semiconductor nanofingers and integrated circuits comprising such transistors.

BACKGROUND

In the field of semiconductor components, conventional transistors typically have an active portion that is completely surrounded by a control electrode for turning the transistor on or off depending on its state of bias. These transistors are often termed GAA (gate-all-around) transistors.

Conventional transistors may include parallel nanofingers resting on a substrate and almost completely surrounded by a control conductor. The drawback to such transistors is that the channel region rests at least completely on a substrate and is therefore not surrounded by the gate electrode.

Conventional MOS transistors with a channel completely surrounded by a gate electrode may, for example, be obtained by what is called the SON (silicon-on-nothing) process. Here, it is necessary to provide a step in which the subjacent layer of the active semiconductor portion is removed. Such a step, or underetching, entails various drawbacks because of the inevitably limited selectivity between the semiconductor intended to form the active zone and the subjacent material, commonly silicon on silicon/germanium. In particular, the channel width of the transistor is limited.

There is therefore a need for improved transistors with fingers exhibiting improved isolation characteristics and a fabrication process to make the same.

SUMMARY

The present disclosure generally provides a process for producing to produce a transistor with fingers by carrying out a small number of steps and economically. The transistor fabrication process comprises steps in which an electron-sensitive resist layer lying between at least two semiconductor wires is formed and said resist lying between at least two wires is converted into a dielectric.

In one embodiment, the present disclosure provides a process for fabricating a transistor. The process includes forming an electron-sensitive resist layer between at least two semiconductor fingers. The process further includes converting the resist layer between the at least two semiconductor fingers into a dielectric.

In another embodiment, the present disclosure provides a transistor device. The transistor device includes at least two semiconductor fingers and a dielectric region disposed between the at least two semiconductor fingers. The dielectric region comprises silicon oxide and hydrogen.

In still another embodiment, the present disclosure provides a method of producing a transistor. The method includes forming an electron-sensitive resist layer between at least two semiconductor fingers and converting the resist layer into a dielectric region comprising silicon oxide and hydrogen.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which:

FIG. 10 is a schematic top view corresponding to the view shown in FIG. 8 according to one embodiment of the present disclosure;

FIG. 11 is a schematic sectional view of the transistor of FIG. 8 during fabrication according to one embodiment of the present disclosure;

FIG. 12 is a schematic sectional view of a transistor according to according to one embodiment of the present disclosure.

DETAILED DESCRIPTION

Figure 1:
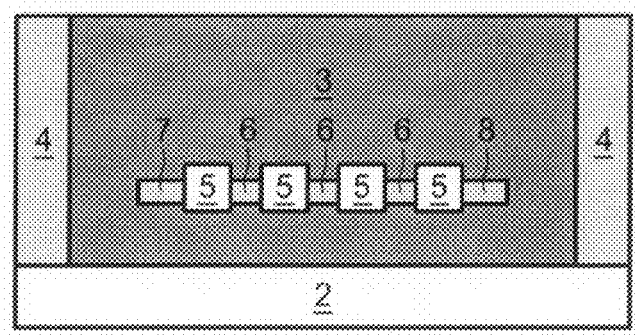
FIG. 1 is a schematic sectional view of a transistor according to one embodiment of the present disclosure.

As illustrated in FIG. 1, in one embodiment of the present disclosure an integrated circuit includes a transistor 1 having an insulating substrate 2 including, for example, based on silicon oxide. Transistor 1 also includes a conducting gate region 3 comprising, for example, TiN or polysilicon, formed on a localized zone of the upper surface of the substrate 2, and an isolating region 4, comprising, for example, silicon oxide and surrounding the conducting region 3. The conducting region 3 is also bounded in the direction normal to the plane of the drawing.

The integrated circuit 1 also includes a plurality of semiconductor fingers 5 lying parallel to one another and passing through the conducting region 3 according to one embodiment of the present disclosure. In one embodiment, the fingers 5 may comprise silicon in the crystalline state. The fingers 5 are placed a certain distance apart. Between each pair of adjacent fingers 5 lies a small dielectric region 6 of slightly smaller height than that of the fingers 5, with a width equal to that of the space separating the two adjacent fingers 5 and with a length equal to that of the conducting region 3 taken in the direction normal to the plane of the drawing according to one embodiment of the present disclosure.

In one embodiment, two end regions 7 and 8, of substantially the same composition as that of the regions 6, which are consequently insulating, are formed in the extension of the dielectric regions 6 beyond the end fingers 5 over a length such that a space is left between the end dielectric regions 7 and 8 and the dielectric region 4. The dielectric regions 7 and 8 have a thickness and a length that are substantially identical to those of the dielectric regions 6. Their width may be larger, while still leaving conducting material of the region 3 between the dielectric region 4 and the end regions 7 and 8. The dielectric regions 6, 7 and 8 are formed substantially at the same distance from the substrate 2. The assembly thus benefits from a multifinger transistor, it being possible for the fingers to be nanofingers with a gate formed all around the fingers 5.

Figure 3:
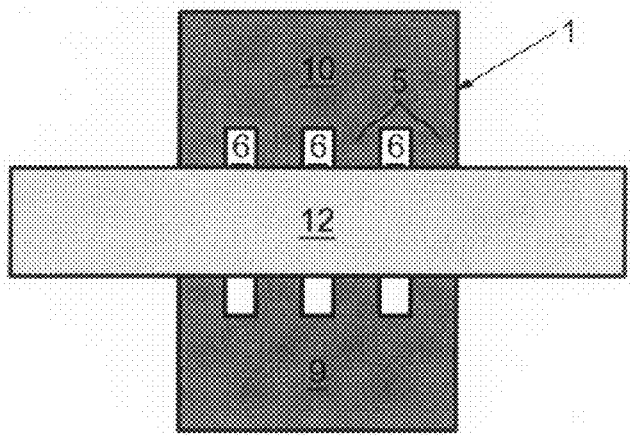
FIG. 3 is a schematic top view corresponding to view shown in FIG. 2 according to one embodiment of the present disclosure.

In one embodiment, integrated circuit 1 is fabricated as follows. The fingers 5 are formed on top of the substrate 2. The fingers 5 are suspended, that is to say separated from the substrate 2 by a temporarily unoccupied space and are connected via their longitudinal ends to drain 9 and source 10 zones (see FIG. 3), also comprising single-crystal silicon and separated from the substrate by at least one insulating layer (not visible in the figures). The fingers 5 may be obtained by the formation of a single-crystal layer of a semiconductor material on a layer of a subjacent material that can be selectively etched with respect to this single-crystal layer, by the etching of parallel partitions in the single-crystal layer in the subjacent layer, and selective etching of the subjacent material with respect to the semiconductor material. The reader may refer in this regard to French Application No. 05/02460 of 8 Aug. 2005 by the same Applicant, the disclosure of which is incorporated herein by reference.

Figure 2:
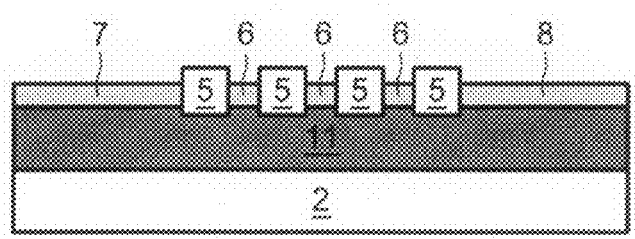
FIG. 2 is a schematic sectional view of the transistor of FIG. 1 during fabrication according to one embodiment of the present disclosure.

Next (see FIG. 2), according to one embodiment of the present disclosure, a layer of an electron-sensitive resist, which is insulating after electron treatment, for example comprising hydrogen silsesquioxane, is deposited on the substrate 2 with a thickness sufficient to come to a level close to the upper surface of the fingers 5, while still remaining below them. The resist layer 11 therefore extends between the substrate 2 and the fingers 5. The resist 11 may be deposited on the entire wafer being fabricated.

Next, said wafer is irradiated (see FIG. 3) with a mask having a feature 12, which in general has the shape of an elongate rectangle perpendicular to the fingers 5, with a width substantially smaller than the length of the fingers 5 and with a length greater than the total width occupied by the fingers 5 between the end portions 7 and 8 and substantially mid-distance between the drain zone 9 and the source zone 10. In one embodiment, the irradiation is performed by a low-energy electron beam, for example with an energy between 1 and 10 keV, and this results in local conversion of the resist 11 into a dielectric beneath the feature 12 and over a thickness limited in such a way that said dielectric is formed at a level above the bottom of the fingers 5, thus creating the isolating zones 6, 7 and 8 visible in FIG. 1. In this way it is possible to achieve isolation between the fingers 5 and at the ends beyond the fingers 5 in accordance with one embodiment of the present disclosure.

Figure 4:
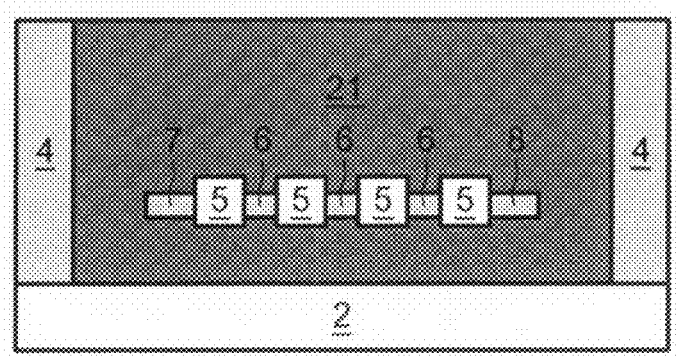
FIGS. 4 and 7 are schematic sectional views of the transistor of FIG. 1 during fabrication according to one embodiment of the present disclosure.
Figure 5:
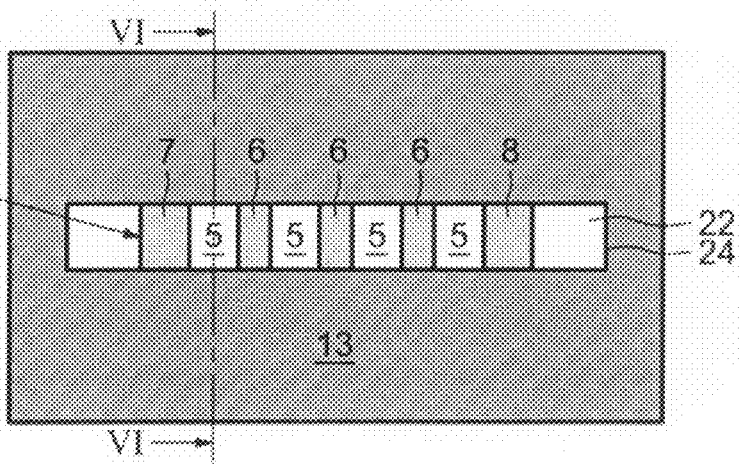
FIG. 5 is a schematic top view corresponding to the view shown in FIG. 4 according to one embodiment of the present disclosure.

In one embodiment, an additional resist layer 21 (see FIG. 4) is then deposited, especially over the entire wafer being fabricated, and then the irradiation is carried out so as to form the feature illustrated in FIG. 5 depthwise down to the substrate 2. A part 13 of the surface of the wafer being fabricated is irradiated with an electron beam of energy between 20 and 100 keV, except for a zone 24, which here has the shape of an elongate rectangle perpendicular to the fingers 5 and of greater length than the feature 12 of FIG. 3.

In one embodiment, part 13 preferably has a rectangular external outline inside which the zone 24 is defined. The part 13 is elongate perpendicular to the fingers 5. The additional resist layer and the resist layer 11, which are located beneath the part 13, are thus converted into a dielectric region 23, for example comprising silicon oxide, except in the zone located beneath the rectangular feature 24, which makes it possible in this way to define the gate length (see FIG. 6). The dielectric region 4 surrounding the feature 24 is also formed, while still leaving the resist layer 11 and additional resist layer 21 beneath the feature 24 according to one embodiment of the present disclosure.

Figure 7:
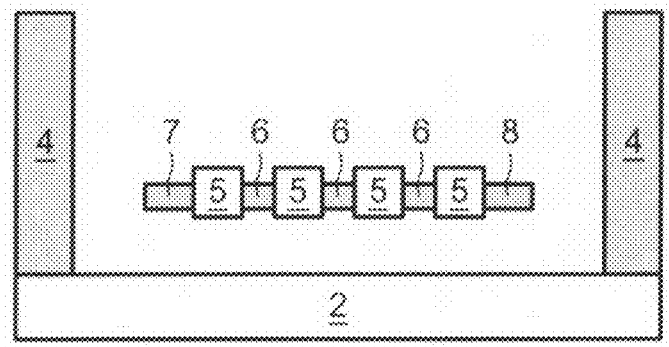

The remaining resist layers 11 and 21 can then be developed, thereby allowing said remaining resist layer 11 to be removed while preserving the dielectric zones 4, 6, 7 and 8 (see FIG. 7), thanks to the fact that the dielectric end zones 7 and 8 lie at some distance from the dielectric layer 4, benefiting from a space 22 for removing the remaining resist layer 11. Next, the gate material, for example made of TiN or polysilicon, may be deposited, followed by a chemical-mechanical polishing step so as to obtain a planar upper surface in order to end up with the transistor illustrated in FIG. 1. Such a transistor is provided with an "all-around" gate according to one embodiment of the present disclosure.

Figure 6:
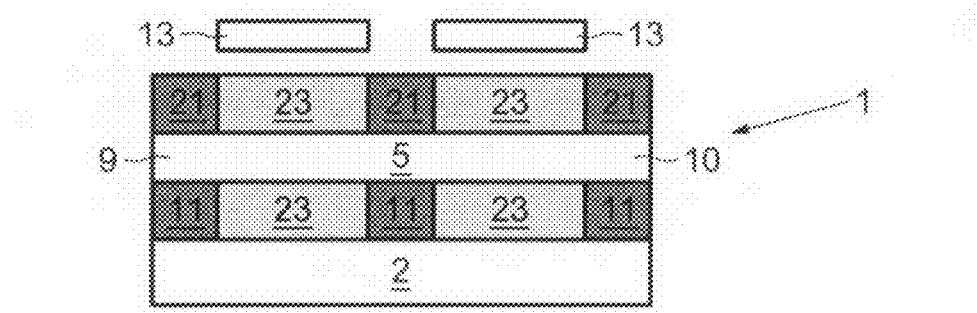
FIG. 6 is a schematic sectional view on VI-VI of FIG. 5 according to one embodiment of the present disclosure.

As may also be seen in FIG. 6, the gate length is preferably defined by the feature formed by the irradiation and passes through the thickness of the fingers 5. The gates are therefore self-aligned, it being possible for one gate to lie beneath the fingers 5 and the other above them, said gates possibly being electrically connected or independent.

Figure 8:
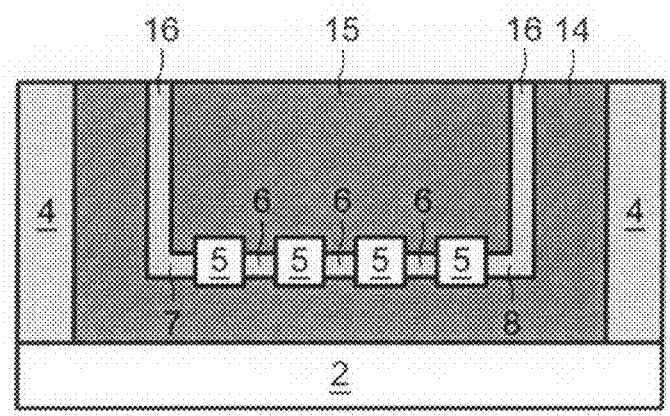
FIG. 8 is a schematic sectional view of a transistor according to one according to one embodiment of the present disclosure.
Figure 9:
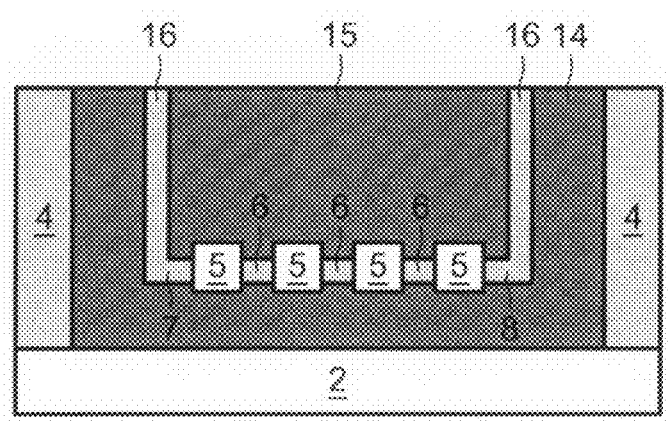
FIG. 9 is a schematic sectional view of the transistor of FIG. 8 during fabrication according to one embodiment of the present disclosure.

The transistor illustrated in FIG. 8 is similar to that illustrated in FIG. 1, except that it includes two gates 14 and 15 isolated from each other. The gate 14 lies beneath the fingers 5, while the gate 15 lies above the fingers 5. The gates 14 and 15 are separated by the dielectric portions 6, 7 and 8, and also by dielectric-filled trenches 16 lying at the ends of the end portions 7 and 8 and joining the upper surface of the gates 14 and 15, hence a separation of the gates 14 and 15 from the electrical standpoint. Thus, according to one embodiment of the present disclosure, a transistor with two gates is formed.

The transistor illustrated in FIG. 8 may be fabricated by means of a second irradiation carried out so as to form the feature 17 illustrated in FIG. 10 following the form of two rectangles corresponding approximately to the ends of the portions 7 and 8 and allowing the resist of the additional layer located above the ends 7 and 8 to be locally converted into a dielectric, especially comprising $SiO_2$. Accordingly, in one embodiment, isolating trenches 16 are obtained which define the position of two gate conductors. After this step, the remaining resist is removed (see FIG. 11) and then the gate material is deposited in order to form the gates 14 and 15, followed by chemical-mechanical polishing in order to improve the planarity of the upper surface of the wafer being fabricated. The transistor illustrated in FIG. 8 is thus obtained.

The transistor 18 illustrated in FIG. 12 is of the type having a diaphragm according to one embodiment of the present disclosure. In other words, the transistor 18 includes a diaphragm 19 comprising silicon instead of the fingers 5. The transistor 18 may be co-integrated on one and the same wafer as the transistor 1. The transistor 18 is of the gate-all-around type and may therefore be obtained by a fabrication process similar to that employed for fabricating the transistor illustrated in FIG. 1, except that the fingers 5 are joined together to form the diaphragm 19.

Figure 13:
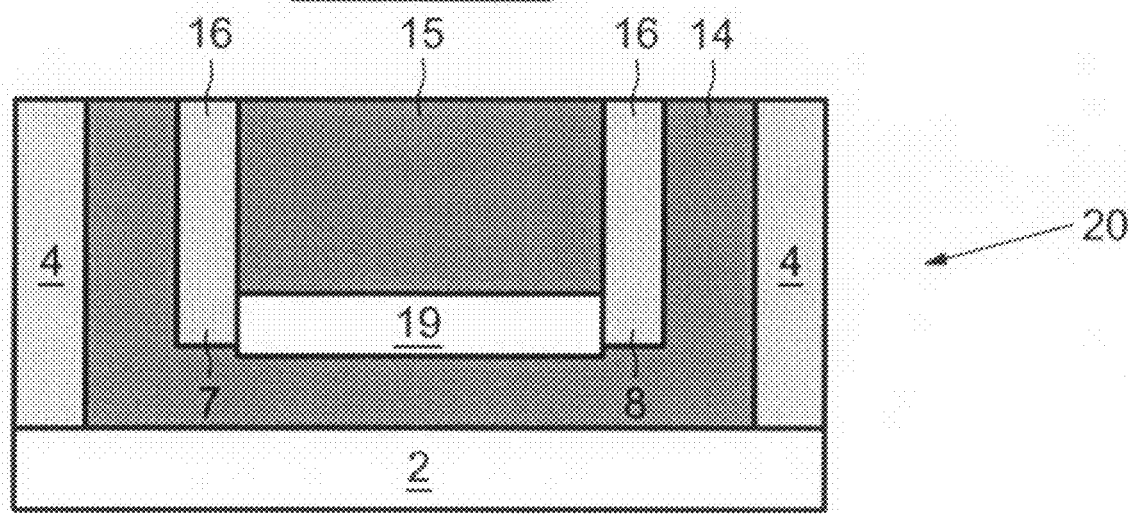
FIG. 13 is a schematic sectional view of a transistor according to according to one embodiment of the present disclosure.

The transistor 20 illustrated in FIG. 13 is of the type with two independent gates and may be fabricated using the same steps as the transistor illustrated in FIG. 8, with fingers 5 joined together to form the diaphragm 19 according to one embodiment of the present disclosure.

In one embodiment, the integrated circuit may comprise at least one transistor with a diaphragm and at least one transistor with fingers. According to one embodiment, the integrated circuit may comprise at least one transistor having independent gates and at least one gate-all-around transistor.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A process for fabricating a transistor, the process comprising:
   forming an electron-sensitive resist layer between at least two semiconductor fingers, the resist layer comprising hydrogen silsesquioxane; and
   converting the resist layer between the at least two semiconductor fingers into a dielectric, wherein the converting of the resist layer is accomplished with an electron beam.

2. The process according to claim 1 further comprising: annealing the converted resist layer.

3. The process according to claim 1 further comprising: removing any unconverted resist from the resist layer.

4. The process according to claim 3, wherein the unconverted resist layer is replaced with a conducting material.

5. The process according to claim 1, wherein the converted resist layer has a thickness less than the thickness of the fingers.

6. The process according to claim 1, wherein the converted resist layer extends beyond the first finger and beyond the last finger of a plurality of parallel fingers.

7. The process according to claim 1 further comprising:
   forming suspended semiconductor fingers separated from a substrate by a temporarily unoccupied space;
   depositing an electron-sensitive resist layer disposed beneath and between at least two semiconductor fingers, wherein one portion of the resist layer is converted into an insulating material between said fingers and at least beyond the first finger and beyond the last finger; and
   depositing an additional electron-sensitive resist layer over at least the at least two semiconductor fingers, wherein one particular zone of the electron-sensitive resist is converted as far as the substrate in order to form a gate insulator and to define the position of gates, and wherein further a remainder of the electron-sensitive resist is removed and at least one gate is formed by depositing conducting material.

8. A method of producing a transistor, the process comprising:
   forming an electron-sensitive resist layer between at least two semiconductor fingers, the resist layer comprising hydrogen silsesquioxane; and
   converting the resist layer into a dielectric region comprising silicon oxide and hydrogen, wherein the converting of the resist layer is accomplished with an electron beam.

9. The method according to claim 8, wherein the fingers comprise at least one of: silicon, germanium, a silicon-germanium alloy, and germanium.

10. The method according to claim 8, wherein the dielectric region has a thickness less than the thickness of one of the semiconductor fingers.

11. The method according to claim 8, wherein the dielectric region has a thickness less than the thickness of the semiconductor fingers.

12. The method according to claim 8, wherein the dielectric region extends beyond the first one of the two semiconductor fingers and beyond the last finger of a plurality of parallel fingers.

13. A process for fabricating a transistor, the process comprising:
   forming an electron-sensitive resist layer between at least two semiconductor fingers, the resist layer comprising hydrogen silsesquioxane; and
   converting the resist layer between the at least two semiconductor fingers into a dielectric, wherein the converting of the resist layer is accomplished by irradiating the resist layer with an electron beam.

14. The process according to claim 1 further comprising:
   annealing the irradiated resist layer; and
   removing any unconverted resist from the resist layer.

15. The process according to claim 1, wherein the converted resist layer has a thickness less than the thickness of the fingers.

16. The process according to claim 1, wherein the converted resist layer extends beyond the first finger and beyond the last finger of a plurality of parallel fingers.

17. The process according to claim 1 further comprising:
   forming suspended semiconductor fingers separated from a substrate by a temporarily unoccupied space;
   depositing an electron-sensitive resist layer disposed beneath and between at least two semiconductor fingers, wherein one portion of the resist layer is converted into an insulating material between said fingers and at least beyond the first finger and beyond the last finger; and
   depositing an additional electron-sensitive resist layer over at least the at least two semiconductor fingers, wherein one particular zone of the electron-sensitive resist is converted as far as the substrate in order to form a gate insulator and to define the position of gates, and wherein further a remainder of the electron-sensitive resist is removed and at least one gate is formed by depositing conducting material.

* * * * *